(12) United States Patent
Xu et al.

(10) Patent No.: US 9,985,014 B2
(45) Date of Patent: May 29, 2018

(54) MINIMUM TRACK STANDARD CELL CIRCUITS FOR REDUCED AREA

(71) Applicant: QUALCOMM Incorporated, San Diego, CA (US)

(72) Inventors: Jeffrey Junhao Xu, San Diego, CA (US); Mustafa Badaroglu, Kessel-Lo (BE); Da Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 105 days.

(21) Appl. No.: 15/266,523

(22) Filed: Sep. 15, 2016

(65) Prior Publication Data

US 2018/0076189 A1 Mar. 15, 2018

(51) Int. Cl.
*G06F 17/50* (2006.01)
*H01L 27/00* (2006.01)
*H01L 27/02* (2006.01)
*H01L 29/423* (2006.01)

(52) U.S. Cl.
CPC ...... *H01L 27/0207* (2013.01); *G06F 17/5068* (2013.01); *G06F 17/5072* (2013.01); *G06F 17/5077* (2013.01); *H01L 29/4232* (2013.01)

(58) Field of Classification Search
None
See application file for complete search history.

(56) References Cited

U.S. PATENT DOCUMENTS

| | | |
|---|---|---|
| 6,737,347 B1 | 5/2004 | Houston et al. |
| 7,923,757 B2 | 4/2011 | Becker et al. |
| 8,183,600 B2 * | 5/2012 | Shimizu .............. H01L 27/0207 257/206 |
| 8,963,210 B2 | 2/2015 | Sengupta et al. |
| 9,269,702 B2 | 2/2016 | Quandt et al. |
| 2010/0148219 A1 | 6/2010 | Shimizu |
| 2012/0280287 A1 | 11/2012 | Hou et al. |
| 2016/0005822 A1 | 1/2016 | Song et al. |
| 2017/0116365 A1* | 4/2017 | Cheng .................. G06F 17/505 |

OTHER PUBLICATIONS

Wu, Joyce H. et al., "A High Aspect-Ratio Silicon Substrate-Via Technology and Applications: Through-Wafer Interconnects for Power and Ground and Faraday Cages for SOC Isolation," International Electron Devices Meeting, Technical Digest, 2000, IEEE, pp. 477-480.
International Search Report and Written Opinion for PCT/US2017/051518, dated Feb. 2, 2018, 18 pages.

* cited by examiner

*Primary Examiner* — Leigh Garbowski
(74) *Attorney, Agent, or Firm* — Withrow & Terranova, PLLC

(57) ABSTRACT

Minimum track standard cell circuits for reduced area are provided. In one aspect, a minimum track standard cell circuit employs a first high aspect ratio voltage rail disposed over a first one-half track and configured to provide a first voltage (e.g., VDD) to the minimum track standard cell circuit. A second high aspect ratio voltage rail is disposed over a second one-half track substantially parallel to the first high aspect ratio voltage rail. The second high aspect ratio voltage rail is configured to provide a second voltage less than the first voltage (e.g., VSS) to the minimum track standard cell circuit. The minimum track standard cell circuit employs multiple tracks disposed between the first and second one-half tracks. The number of tracks can be limited based on particular factors. Minimizing tracks reduces area compared to conventional standard cell circuits.

26 Claims, 8 Drawing Sheets

MINIMUM TRACK STANDARD CELL CIRCUITS FOR REDUCED AREA

BACKGROUND

I. Field of the Disclosure

The technology of the disclosure relates generally to standard cell circuits, and particularly to reducing area of standard cell circuits.

II. Background

Processor-based computer systems can include a vast array of integrated circuits (ICs). Each IC has a complex layout design comprised of multiple IC devices. Standard cell circuits are often employed to assist in making the design of ICs less complex and more manageable. In particular, standard cell circuits provide a designer with pre-designed cells corresponding to commonly used IC devices that conform to specific design rules of a chosen technology. As non-limiting examples, standard cell circuits may include gates, inverters, multiplexers, and adders. Using standard cell circuits enables a designer to create ICs having consistent layout designs, thereby creating a more uniform and less complex layout design across multiple ICs, as compared to custom designing each circuit.

Conventional standard cell circuits are fabricated using process technologies that form device elements with a pre-defined technology node size. For example, a process technology may be employed to fabricate a conventional standard cell circuit with device elements approximately fourteen (14) nanometers or ten (10) nm wide. Process technologies continue to enable decreased technology node size, which allows a higher number of device elements, such as transistors, to be disposed in less area within a circuit. As technology node size scales down, metal lines within a conventional standard cell circuit also scale down to reduce the overall area of a conventional standard cell circuit. For example, as the technology node size is reduced, metal lines disposed in both an x-coordinate and y-coordinate direction may be scaled down by approximately thirty percent (30%) such that the conventional standard cell circuit has a scaling factor of approximately 0.7 in each direction. The total scaling factor of the conventional standard cell circuit is approximately equal to fifty percent (50%) (i.e., 0.7 in the x-coordinate direction×0.7 in the y-coordinate direction=49%, approximately 50%). Therefore, a conventional standard cell circuit can achieve an area reduction of approximately 50% in response to a scaled down technology node size.

However, as the technology node size scales down to ten (10) nm and below, metal lines within a conventional standard cell circuit cannot continue to scale by 30% percent due to gate pitch and metal pitch limitations. Thus, conventional standard cell circuits cannot achieve a desired area reduction of approximately 50% at technology node sizes of 10 nm or less.

SUMMARY OF THE DISCLOSURE

Aspects disclosed herein include minimum track standard cell circuits for reduced area. In one aspect, a minimum track standard cell circuit is provided. The minimum track standard cell circuit employs a first high aspect ratio voltage rail disposed over a first one-half track and configured to provide a first voltage (e.g., a supply voltage, VDD) to the minimum track standard cell circuit. The minimum track standard cell circuit also employs a second high aspect ratio voltage rail disposed over a second one-half track substantially parallel to the first high aspect ratio voltage rail. The second high aspect ratio voltage rail is configured to provide a second voltage less than the first voltage (e.g., a ground voltage, VSS) to the minimum track standard cell circuit. The first and second high aspect ratio voltage rails each have a height to width ratio greater than one (1), such that the height of the respective first and second high aspect ratio voltage rail is greater than the corresponding width. Employing the first and second high aspect ratio voltage rails as described above allows each of the first and second high aspect ratio voltage rails to consume less width while achieving a similar resistance compared to a voltage rail in a conventional standard cell circuit. Additionally, the minimum track standard cell circuit employs multiple tracks disposed between the first and second one-half tracks, each of which are configured to support metal line routing. However, the number of tracks can be limited based on particular factors, such as according to the width of the first and second high aspect ratio voltage rails, for example. Minimizing the number of tracks in this manner further reduces area compared to conventional standard cell circuits, even as technology node size scales to ten (10) nanometers (nm) and below.

In this regard in one aspect, a minimum track standard cell circuit is provided. The minimum track standard cell circuit comprises a first one-half track. The minimum track standard cell circuit also comprises a first high aspect ratio voltage rail disposed over the first one-half track. The first high aspect ratio voltage rail has a height to width ratio greater than one (1) and is configured to provide a first voltage to the minimum track standard cell circuit. The minimum track standard cell circuit also comprises a second one-half track. The minimum track standard cell circuit also comprises a second high aspect ratio voltage rail disposed over the second one-half track and substantially parallel to the first high aspect ratio voltage rail. The second high aspect ratio voltage rail has a height to width ratio greater than one (1) and is configured to provide a second voltage less than the first voltage to the minimum track standard cell circuit. The minimum track standard cell circuit also comprises a plurality of tracks disposed between and substantially parallel to the first and second one-half tracks.

In another aspect, a minimum track standard cell circuit is provided. The minimum track standard cell circuit comprises a means for providing a first one-half track. The minimum track standard cell circuit also comprises a means for providing a first high aspect ratio voltage rail over the first one-half track. The first high aspect ratio voltage rail has a height to width ratio greater than one (1) and is configured to provide a first voltage to the minimum track standard cell circuit. The minimum track standard cell circuit also comprises a means for providing a second one-half track. The minimum track standard cell circuit also comprises a means for providing a second high aspect ratio voltage rail over the second one-half track and substantially parallel to the first high aspect ratio voltage rail. The second high aspect ratio voltage rail has a height to width ratio greater than one (1) and is configured to provide a second voltage less than the first voltage to the minimum track standard cell circuit. The minimum track standard cell circuit also comprises a means for providing a plurality of tracks between and substantially parallel to the first and second one-half tracks.

In another aspect, a method of manufacturing a minimum track standard cell circuit is provided. The method comprises forming a first one-half track. The method also comprises disposing a first high aspect ratio voltage rail over the first one-half track. The first high aspect ratio voltage rail has a height to width ratio greater than one (1) and is configured to provide a first voltage to the minimum track standard cell circuit. The method also comprises forming a second one-half track. The method also comprises disposing a second high aspect ratio voltage rail over the second one-half track and substantially parallel to the first high aspect ratio voltage rail. The second high aspect ratio voltage rail has a height to width ratio greater than one (1) and is configured to provide a second voltage less than the first voltage to the minimum track standard cell circuit. The method also comprises disposing a plurality of tracks between and substantially parallel to the first and second one-half tracks.

DETAILED DESCRIPTION

Figure 1A:
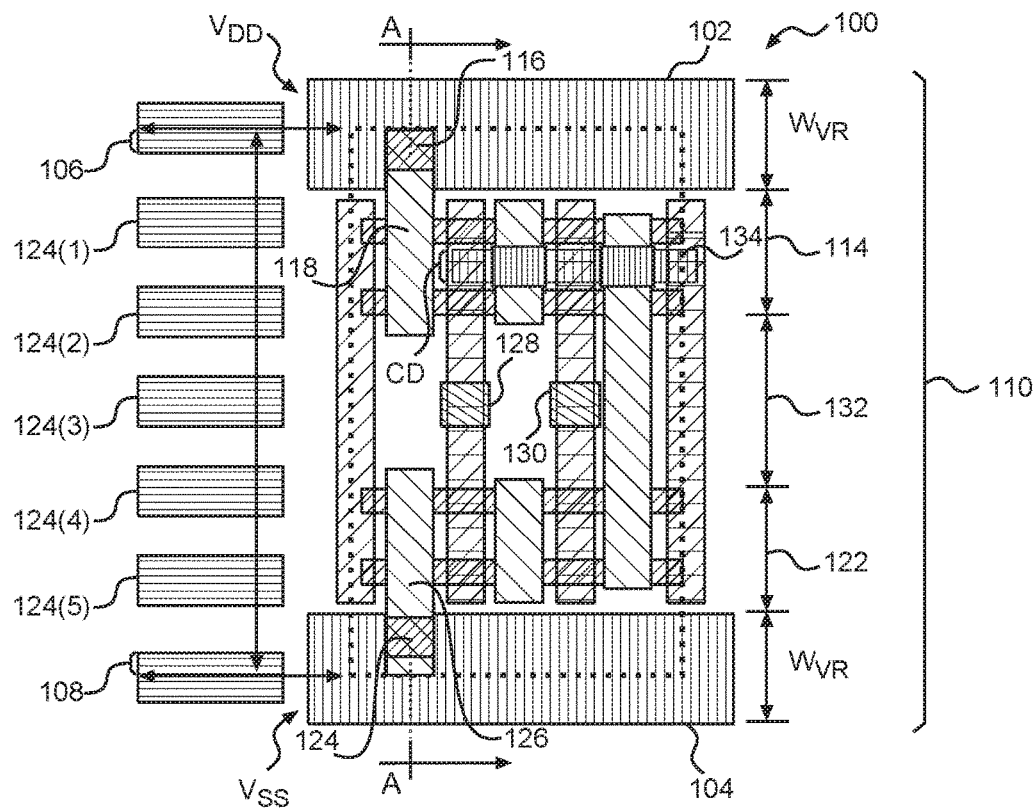
FIG. 1A is a top-view diagram of a conventional standard cell circuit employing six (6) tracks.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include minimum track standard cell circuits for reduced area. In one aspect, a minimum track standard cell circuit is provided. The minimum track standard cell circuit employs a first high aspect ratio voltage rail disposed over a first one-half track and configured to provide a first voltage (e.g., a supply voltage, VDD) to the minimum track standard cell circuit. The minimum track standard cell circuit also employs a second high aspect ratio voltage rail disposed over a second one-half track substantially parallel to the first high aspect ratio voltage rail. The second high aspect ratio voltage rail is configured to provide a second voltage less than the first voltage (e.g., a ground voltage, VSS) to the minimum track standard cell circuit. The first and second high aspect ratio voltage rails each have a height to width ratio greater than one (1), such that the height of the respective first and second high aspect ratio voltage rail is greater than the corresponding width. Employing the first and second high aspect ratio voltage rails as described above allows each of the first and second high aspect ratio voltage rails to consume less width while achieving a similar resistance compared to a voltage rail in a conventional standard cell circuit. Additionally, the minimum track standard cell circuit employs multiple tracks disposed between the first and second one-half tracks, each of which are configured to support metal line routing. However, the number of tracks can be limited based on particular factors, such as according to the width of the first and second high aspect ratio voltage rails, for example. Minimizing the number of tracks in this manner further reduces area compared to conventional standard cell circuits, even as technology node size scales to ten (10) nanometers (nm) and below.

Figure 1B:
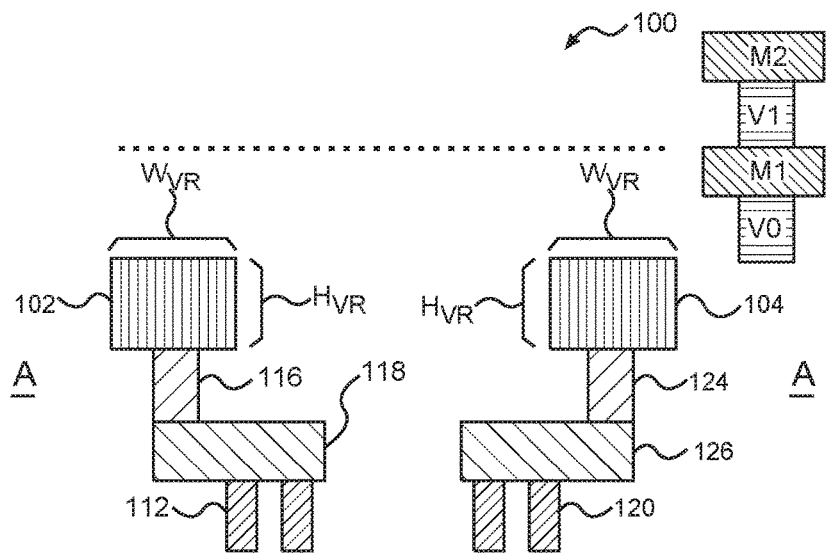
FIG. 1B is a cross-sectional diagram of the conventional standard cell circuit of FIG. 1A.
Figure 2A:
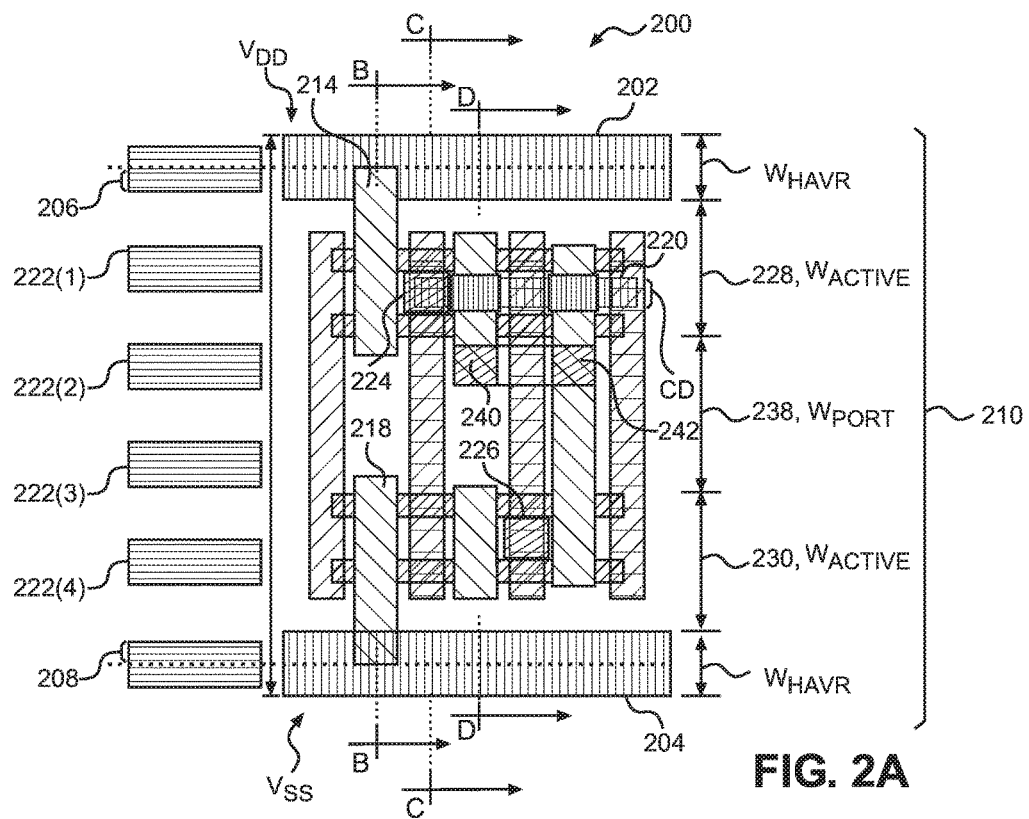
FIG. 2A is a top-view diagram of an exemplary minimum track standard cell circuit employing five (5) tracks for reduced area.

Before discussing the details of minimum track standard cell circuits beginning in FIG. 2A, conventional standard cell circuits are first described. In this regard, FIGS. 1A and 1B illustrate a conventional standard cell circuit 100. FIG. 1A illustrates a top-view diagram of the conventional standard cell circuit 100, while FIG. 1B illustrates a cross-sectional view of the conventional standard cell circuit 100.

With reference to FIGS. 1A and 1B, the conventional standard cell circuit 100 includes first and second voltage rails 102, 104, respectively. The first voltage rail 102 is disposed over a first one-half track 106, and the second voltage rail 104 is disposed over a second one-half track 108. The first and second voltage rails 102, 104 provide corresponding voltages to a device 110 disposed between the first and second voltage rails 102, 104 in the conventional standard cell circuit 100. For example, the first voltage rail 102 may provide a higher voltage VDD to the device 110, while the second voltage rail 104 may provide a lower voltage VSS to the device 110. In particular, the first voltage rail 102 is electrically coupled to a first power input 112 corresponding to a first active area 114 by way of a via 116 and a contact layer interconnect 118. Additionally, the second voltage rail 104 is electrically coupled to a second power input 120 corresponding to a second active area 122 by way of a via 124 and a contact layer interconnect 126. The first and second voltage rails 102, 104 each have a height $H_{VR}$ that is less than a width $W_{VR}$ (i.e., a height to width ratio of less than one (1)). Due to the height $H_{VR}$, elements (not shown) in a zero via level V0, a first metal layer M1, and a first via level V1 are employed to electrically couple the first and second voltage rails 102, 104 to a routing interconnect (not shown) on a second metal layer M2.

With continuing reference to FIGS. 1A and 1B, the device 110 is formed from multiple circuit elements within the conventional standard cell circuit 100. In particular, multiple circuit elements, such as transistors, can be formed from the first active area 114 and the second active area 122 to form the device 110. Such transistors can be electrically coupled using metal line routing to cause the device 110 to perform a particular function. Tracks 124(1)-124(5) are employed between the first and second voltage rails 102, 104 to allow for the metal line routing of the device 110. Additionally, input values can be provided to the transistors formed from the first and second active areas 114, 122 using corresponding gate contacts 128, 130. In particular, the gate contacts 128, 130 are disposed in a port zone 132 formed between the first and second active areas 114, 122. In this manner, the conventional standard cell circuit 100 is a six (6)-track standard cell circuit with gate access provided by the gate contacts 128, 130 in the port zone 132. In particular, the first and second one-half tracks 106, 108 account for one (1) track, which combines with the five (5) tracks 124(1)-124(5) for a total of six (6) tracks.

With continuing reference to FIGS. 1A and 1B, as the technology node size scales down to ten (10) nm and below, the conventional standard cell circuit 100 can achieve only limited area reduction. For example, the width $W_{VR}$ of the first and second voltage rails 102, 104, cannot be decreased to reduce the area of the conventional standard cell circuit 100 due to resistance limitations. More specifically, the width $W_{VR}$ is approximately equal to three (3) times a critical dimension CD (e.g., width) of metal lines in the conventional standard cell circuit 100, such as a metal line 134. Reducing the width $W_{VR}$ would cause a resistance (R) of both the first and second voltage rails 102, 104 to increase, thus increasing a current-resistance (IR) drop (i.e., voltage drop) of the first and second voltage rails 102, 104. The increased IR drop would reduce the voltage delivered by the first and second voltage rails 102, 104 to a level low enough to prevent activation of circuit elements, thus causing the conventional standard cell circuit 100 to produce erroneous output. Additionally, metal lines within the conventional standard cell circuit 100 cannot continue to scale due to gate pitch and metal pitch limitations. In particular, metal lines corresponding to the metal line routing employed within the tracks 124(1)-124(5) cannot scale down by a percentage needed to achieve an area reduction of fifty percent (50%) as the technology node size scales down to ten (10) nm and below.

In this regard, FIGS. 2A-2D illustrate an exemplary minimum track standard cell circuit 200 employing five (5) tracks to achieve reduced area. FIG. 2A illustrates a top-view diagram of the minimum track standard cell circuit 200, while FIGS. 2B-2D each illustrate a cross-sectional view of the minimum track standard cell circuit 200.

With continuing reference to FIGS. 2A-2D, the minimum track standard cell circuit 200 employs a first high aspect ratio voltage rail 202 and a second high aspect ratio voltage rail 204. The first high aspect ratio voltage rail 202 is disposed over a first one-half track 206 and configured to provide a first voltage (e.g., a source voltage (VDD)) to the minimum track standard cell circuit 200. The second high aspect ratio voltage rail 204 is disposed over a second one-half track 208 substantially parallel to the first high aspect ratio voltage rail 202. The second high aspect ratio voltage rail 204 is configured to provide a second voltage less than the first voltage (e.g., a ground voltage (VSS)) to the minimum track standard cell circuit 200. For example, the first and second high aspect ratio voltage rails 202, 204 are configured to provide the first voltage (VDD) and the second voltage (VSS), respectively, to a device 210 formed from multiple circuit elements disposed between the first and second high aspect ratio voltage rails 202, 204. In particular, the first high aspect ratio voltage rail 202 is electrically coupled to a first power input 212 of the device 210 by way of a contact layer interconnect 214. The second high aspect ratio voltage rail 204 is electrically coupled to a second power input 216 of the device 210 by way of a contact layer interconnect 218.

With continuing reference to FIGS. 2A-2D, to minimize the area of the minimum track standard cell circuit 200, the first and second high aspect ratio voltage rails 202, 204 are scaled to each have a width $W_{HAVR}$ that is less than three (3) times a critical dimension CD (i.e., width) of a metal line 220 disposed in the minimum track standard cell circuit 200. In other aspects, the width $W_{HAVR}$ may be less than (2) times the critical dimension CD of the metal line 220. Additionally, the width $W_{HAVR}$ may be approximately equal to the critical dimension CD. However, because the first and second high aspect ratio voltage rails 202, 204 are formed from a conductive material, the first and second high aspect ratio voltage rails 202, 204 each have a resistance that is inversely proportional to the area of the conductive material. In this manner, to achieve a desired resistance, and thus a desired IR drop (i.e., voltage drop), while employing the width $W_{HAVR}$, the first and second high aspect ratio voltage rails 202, 204 each have a height to width ratio greater than one (1). More specifically, a height $H_{HAVR}$ of the respective first and second high aspect ratio voltage rail 202, 204 is greater than the width $W_{HAVR}$. In this example, the height $H_{HAVR}$ is four (4) times the width $W_{HAVR}$ such that the height to width ratio of the first and second high aspect ratio voltage rails 202, 204 is equal to four (4).

With continuing reference to FIGS. 2A-2D, in this example, the first and second high aspect ratio voltage rails 202, 204 each extend into a zero via level V0 and a first metal layer M1. Due to the height $H_{HAVR}$ of the first and second high aspect ratio voltage rails 202, 204, elements in a zero via level V0 and a first metal layer M1 are not needed in addition to a first via level V1 to electrically couple the first and second high aspect ratio voltage rails 202, 204 to a routing interconnect (not shown) on a second metal layer M2. Setting the height $H_{HAVR}$ to be greater than the width $W_{HAVR}$ in this manner minimizes the resistance of the first and second high aspect ratio voltage rails 202, 204 even as the $W_{HAVR}$ is reduced. Thus, employing the first and second high aspect ratio voltage rails 202, 204 with a greater height $H_{HAVR}$ than width $W_{HAVR}$ allows the first and second high aspect ratio voltage rails 202, 204 to have an area large enough to achieve a resistance corresponding to a particular IR drop (i.e., voltage drop), while also reducing the area of the minimum track standard cell circuit 200.

With continuing reference to FIGS. 2A-2D, the minimum track standard cell circuit 200 further minimizes area by employing fewer tracks than the conventional standard cell circuit 100 in FIG. 1A. More specifically, the minimum track standard cell circuit 200 can employ fewer tracks based in part on the reduced width $W_{HAVR}$. In this aspect, the minimum track standard cell circuit 200 employs tracks 222(1)-222(4) disposed between and substantially parallel to the first and second one-half tracks 206, 208. Each track 222(1)-222(4) is configured to support metal line routing of the device 210. In this manner, the minimum track standard cell circuit 200 is a five (5)-track standard cell circuit, as the first and second one-half tracks 206, 208 account for one (1) track, which combine with the four (4) tracks 222(1)-222(4) for a total of five (5) tracks.

With continuing reference to FIGS. 2A-2D, another way to minimize the number of tracks 222(1)-222(4) disposed between the first and second one-half tracks 206, 208 is by employing gate contacts 224, 226 over first and second active areas 228, 230, respectively. As discussed in greater detail below, the gate contacts 224, 226 in this aspect are self-aligned with gates of corresponding transistors. For example, with particular reference to FIG. 2C, the gate contact 224 is self-aligned with a gate 232 disposed over Fins 234(1), 234(2) of a corresponding Fin Field Effect Transistor (FET) (FinFET) 236. The gate 232 may be one of multiple types of gates, such as, but not limited to, a polysilicon gate or high dielectric constant metal gate (HKMG).

With continuing reference to FIGS. 2A-2D, employing the gate contacts 224, 226 over the corresponding first and second active areas 228, 230 reduces the amount of metal line routing needed between the first and second active areas 228, 230. As a result, fewer tracks 222(1)-222(4) are disposed between the first and second active areas 228, 230 compared to the conventional standard cell circuit 100 in FIG. 1A. Having fewer tracks 222(1)-222(4) allows the minimum track standard cell circuit 200 to employ a smaller port zone 238 compared to the port zone 132 in the conventional standard cell circuit 100 of FIG. 1A, which further reduces the area of the minimum track standard cell circuit 200. In other words, employing the gate contacts 224, 226 in the first and second active areas 228, 230 instead of in the port zone 238 allows for less metal line routing in the port zone 238, and thus further scaling of the port zone 238. Additionally, with particular reference to FIG. 2D, a low aspect ratio metal line 240 and a via 242 can be disposed on a contact layer interconnect 244 in the port zone 238 for intra-cell routing to allow for metal line pitch tightening and reduced parasitic capacitance. Employing the first and second high aspect ratio voltage rails 202, 204 while also minimizing the number of tracks in this manner reduces the area of the minimum track standard cell circuit 200 compared to the conventional standard cell circuit 100 of FIG. 1A, even as technology node size scales to ten (10) nm.

With continuing reference to FIGS. 2A-2D, as a non-limiting example, when fabricating the minimum track standard cell circuit 200 with a technology node size approximately equal to ten (10) nm, a width $W_{CELL}$ of the minimum track standard cell circuit 200 may be approximately equal to 140 nm. A width $W_{ACTIVE}$ of each of the first and second active areas 228, 230 may be approximately equal to sixty-two (62) nm, and a width $W_{PORT}$ of the port zone 238 may be approximately equal to twenty-four (24) nm, plus or minus a standard margin. Further, the critical dimension CD of the metal line 220 may be approximately equal to fourteen (14) nm. The first and second high aspect ratio voltage rails 202, 204 may each have a width $W_{HAVR}$ approximately equal to twenty-eight (28) nm, which is less than three (3) times the critical dimension CD of the metal line 220 (i.e., 28 nm<(3×14 nm)=42 nm). In another example, the first and second high aspect ratio voltage rails 202, 204 may each have a width $W_{HAVR}$ approximately equal to fourteen (14) nm, which is less than three (3) times the critical dimension CD of the metal line 220 (i.e., 14 nm< (3×14 nm)=42 nm). Additionally, in the example in which the width $W_{HAVR}$ is approximately equal to fourteen (14) nm (e.g., approximately equal to the critical dimension CD), the gate contacts 224, 226 may be employed either over the corresponding first and second active areas 228, 230 (e.g., self-aligned gate contacts 224, 226), or within the port zone 238.

Figure 3:
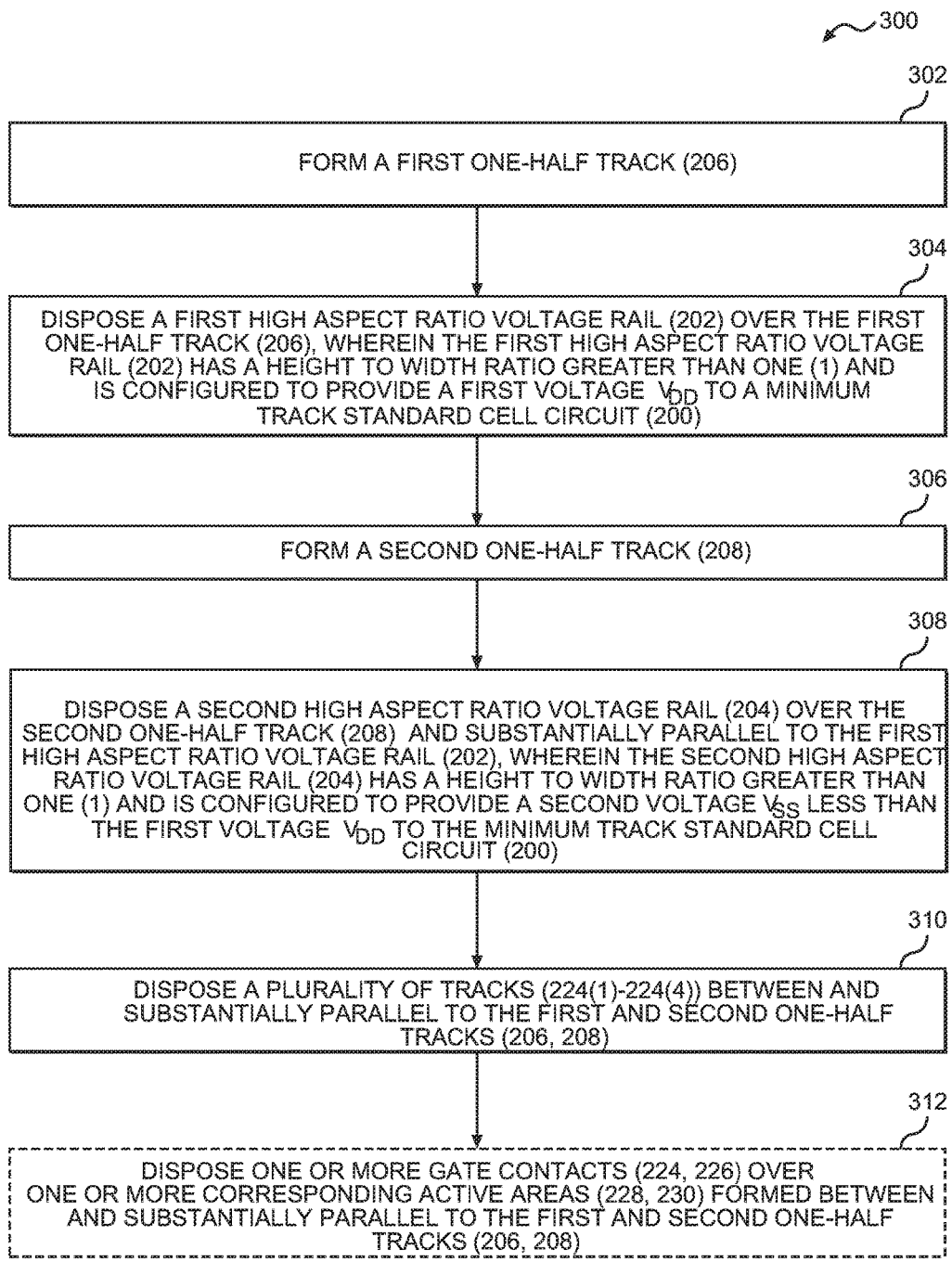
FIG. 3 is a flowchart illustrating an exemplary process for fabricating the minimum track standard cell circuit employing five (5) tracks for reduced area of FIG. 2A.

FIG. 3 illustrates an exemplary process 300 for fabricating the minimum track standard cell circuit 200 of FIG. 2A. In this regard, the process 300 includes forming the first one-half track 206 (block 302). The process 300 also includes disposing the first high aspect ratio voltage rail 202 over the first one-half track 206 (block 304). As previously described, the first high aspect ratio voltage rail 202 has a height to width ratio greater than one (1) and is configured to provide the first voltage (e.g., VDD) to the minimum track standard cell circuit 200. The process 300 further includes forming the second one-half track 208 (block 306). Additionally, the process 300 includes disposing the second high aspect ratio voltage rail 204 over the second one-half track 208 and substantially parallel to the first high aspect ratio voltage rail 202 (block 308). As previously described, the second high aspect ratio voltage rail 204 has a height to width ratio greater than one (1) and is configured to provide the second voltage (e.g., VSS) less than the first voltage (e.g., VDD) to the minimum track standard cell circuit 200. The process 300 also includes disposing the tracks 222(1)-222(4) between and substantially parallel to the first and second one-half tracks 206, 208 (block 310). The process 300 can also include disposing the gate contacts 224, 226 over the first and second active areas 228, 230 formed between and substantially parallel to the first and second one-half tracks 206, 208 (block 312).

Figure 4:
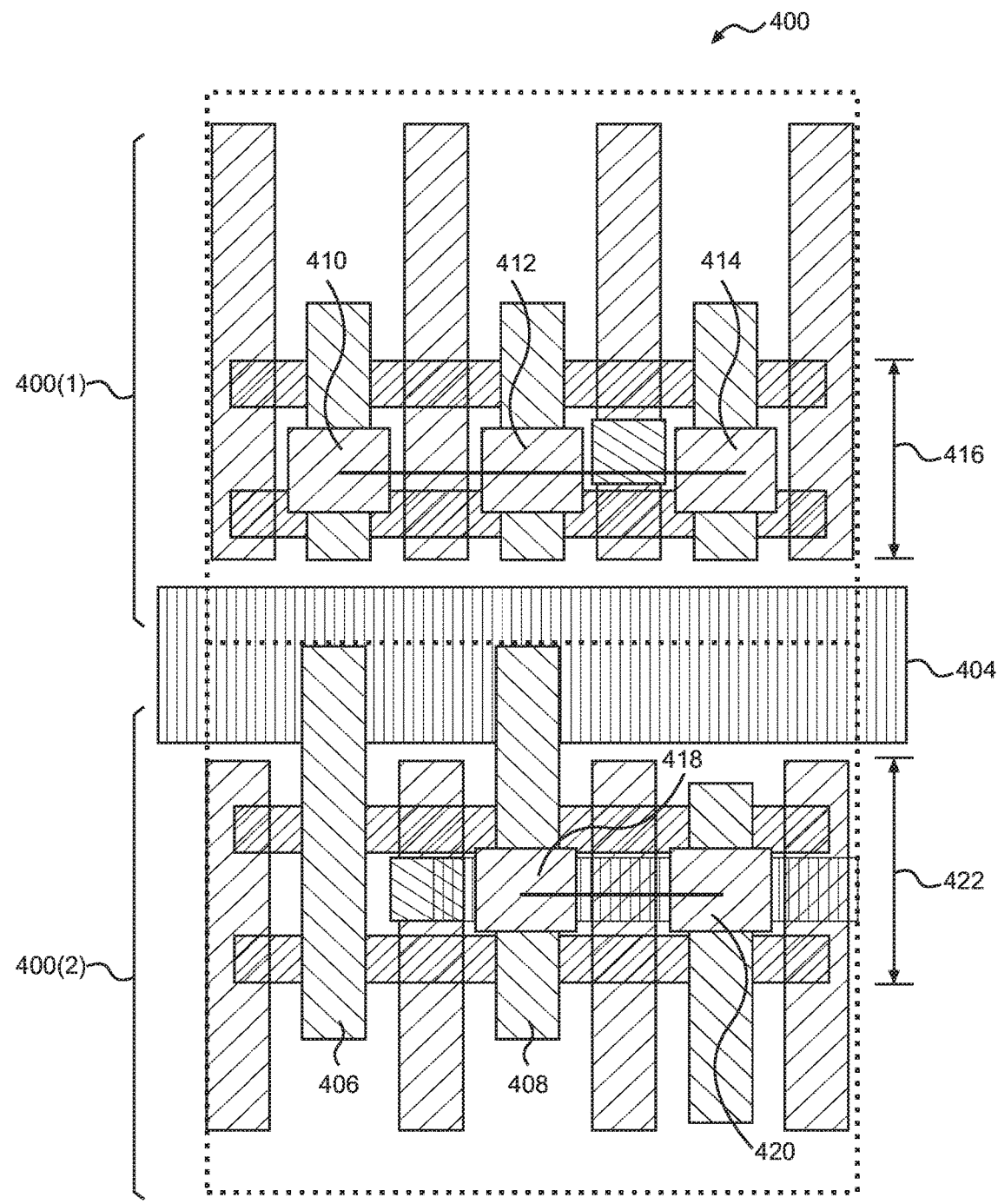
FIG. 4 is a top-view diagram of an exemplary circuit employing minimum track standard cell circuits without vias for electrically coupling a high aspect ratio voltage rail to contact layer interconnects.

In addition to achieving a reduced area, minimum track standard cell circuits such as the minimum track standard cell circuit 200 of FIG. 2A can also have lower fabrication costs and resistance compared to conventional standard cell circuits. In this regard, FIG. 4 illustrates a top-view diagram of an exemplary circuit 400 employing minimum track standard cell circuits 402(1), 402(2) without vias for electrically coupling a high aspect ratio voltage rail 404 to contact layer interconnects 406, 408. More specifically, the minimum track standard cell circuits 402(1), 402(2) share the high aspect ratio voltage rail 404 in the circuit 400. The high aspect ratio voltage rail 404 may be configured to provide a supply voltage VDD to the minimum track standard cell circuits 402(1), 402(2), while additional high aspect ratio voltage rails (not shown) may be configured to provide a ground voltage VSS. In this aspect, vias 410, 412, and 414 employed in an active area 416 of the minimum track standard cell circuit 402(1) are formed using a corresponding fabrication mask, and have a corresponding resistance. Similarly, vias 418, 420 employed in an active area 422 of the minimum track standard cell circuit 402(2) are formed using a different fabrication mask than that used to form the vias 410, 412, and 414, and also have a corresponding resistance.

With continuing reference to FIG. 4, the high aspect ratio voltage rail 404 is employed with a height to width ratio large enough such that the high aspect ratio voltage rail 404 electrically couples to the contact layer interconnects 406, 408 without vias. In this manner, the circuit 400 does not require the use of a fabrication mask or incur additional resistance corresponding to such vias disposed over the high aspect ratio voltage rail 404. In contrast, conventional standard cell circuits similar to the conventional standard cell circuit 100 of FIG. 1A employ vias to electrically couple a corresponding voltage rail to the contact layer interconnects 406, 408, thus necessitating an additional fabrication mask and incurring additional resistance. Therefore, employing the minimum track standard cell circuits 402(1), 402(2) lowers fabrication costs and resistance of the circuit 400 compared to other circuits employing conventional standard cell circuits.

In addition to the minimum track standard cell circuit 200 of FIG. 2A, other aspects may be employed with alternative features. For example, the first and second high aspect ratio voltage rails 202, 204 can be employed with alternative height to width ratios based on particular design or fabrication parameters.

Figure 2B:
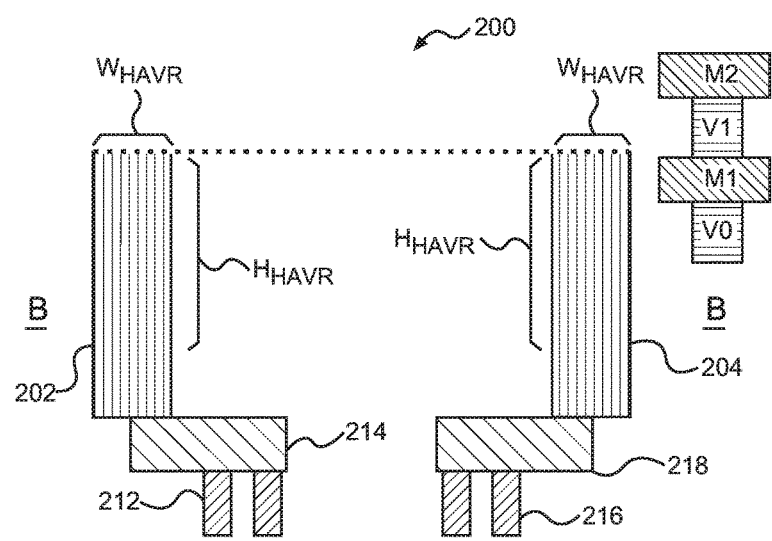
FIG. 2B is a cross-sectional diagram of the minimum track standard cell circuit employing five (5) tracks for reduced area of FIG. 2A.
Figure 2C:
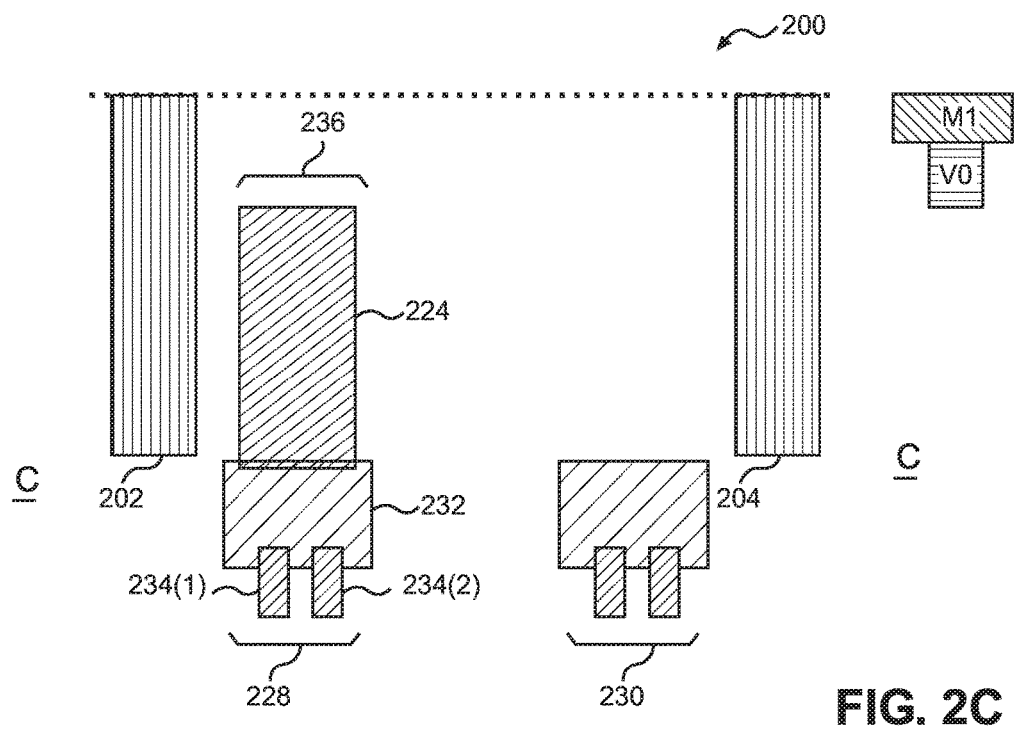
FIG. 2C is another cross-sectional diagram of the minimum track standard cell circuit employing five (5) tracks for reduced area of FIG. 2A.
Figure 2D:
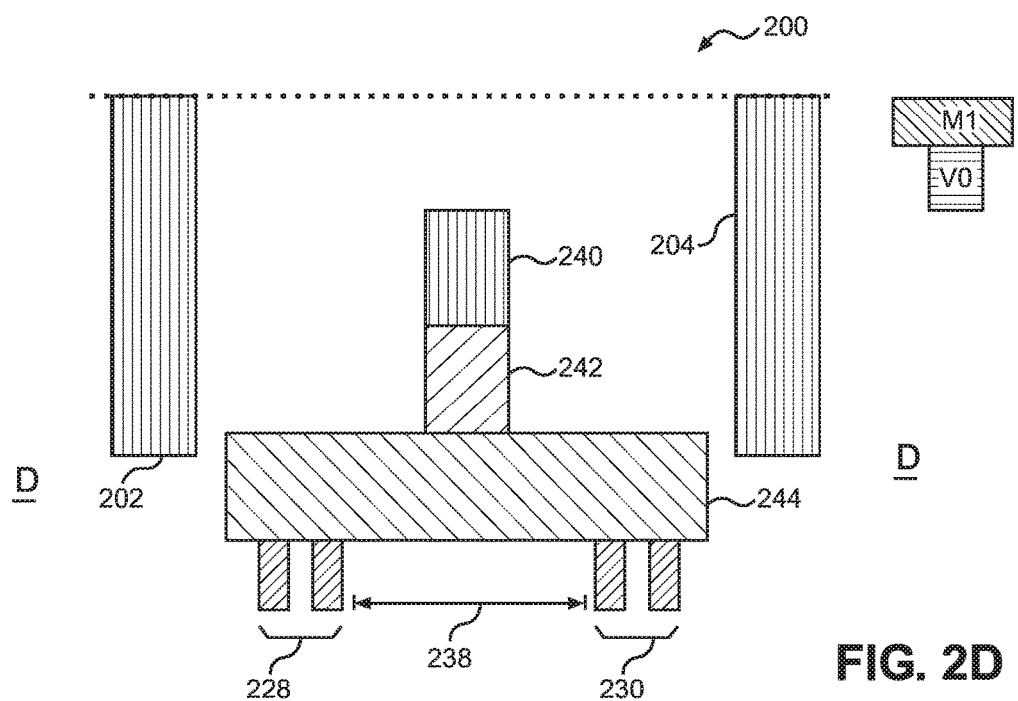
FIG. 2D is another cross-sectional diagram of the minimum track standard cell circuit employing five (5) tracks for reduced area of FIG. 2A.
Figure 5:
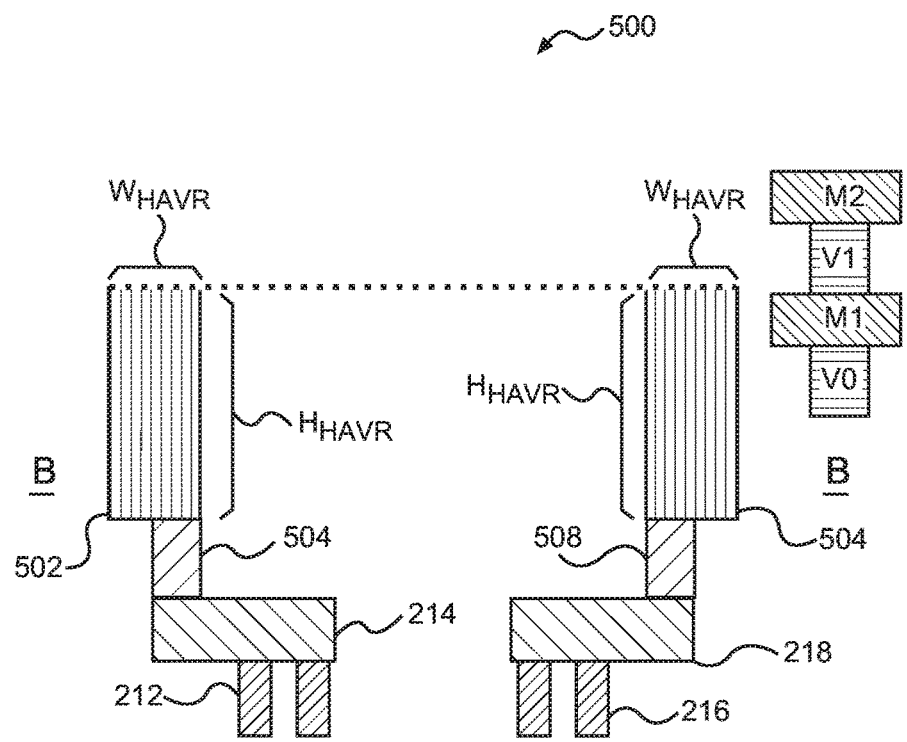
FIG. 5 is a cross-sectional diagram of another exemplary minimum track standard cell circuit employing high aspect ratio voltage rails with a height to width ratio of approximately three (3)

In this regard, FIG. 5 illustrates a cross-sectional view of an exemplary minimum track standard cell circuit 500 similar to the cross-sectional view illustrated in FIG. 2B. The minimum track standard cell circuit 500 includes certain components in common with the minimum track standard cell circuit 200 in FIG. 2B, as shown by similar element numbers between FIGS. 2A and 5, and thus will not be re-described herein.

With continuing reference to FIG. 5, rather than employing the first and second high aspect ratio voltage rails 202, 204 with a height to width ratio approximately equal to four (4), the minimum track standard cell circuit 500 employs first and second high aspect ratio voltage rails 502, 504 with a height to width ratio of approximately three (3). In particular, the first and second high aspect ratio voltage rails 502, 504 are employed with a height $H_{HAVR}$ that is three (3) times a width $W_{HAVR}$. In this manner, unlike the first and second high aspect ratio voltage rails 202, 204 in FIG. 2B, the first and second high aspect ratio voltage rails 502, 504 do not extend from the corresponding contact layer interconnects 214, 218 to the first via level V1. As a result, the minimum track standard cell circuit 500 employs vias 506, 508 to electrically couple the first and second high aspect ratio voltage rails 502, 504, respectively, to the corresponding contact layer interconnects 214, 218.

Figure 6:
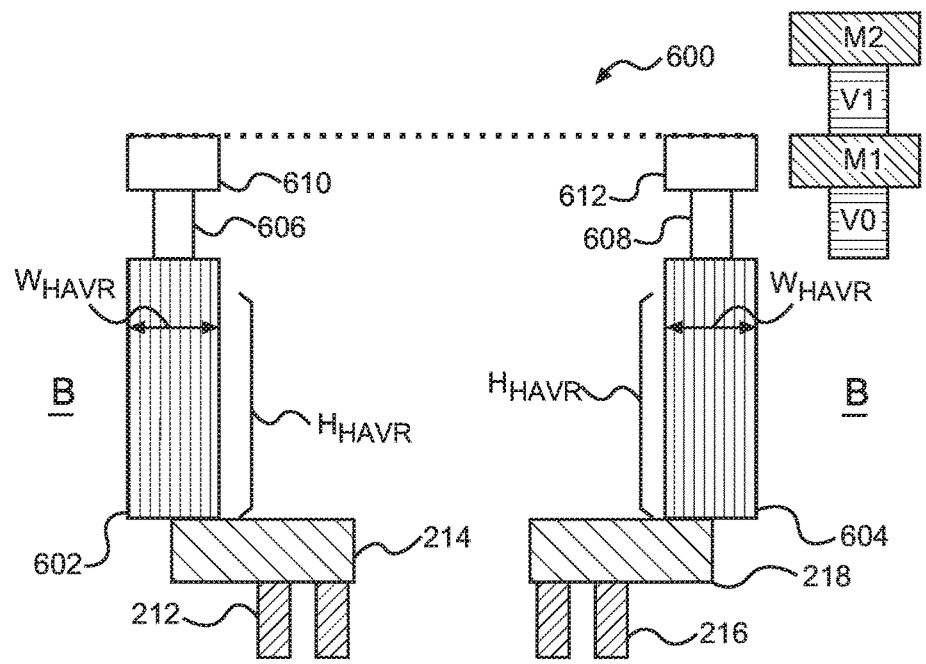
FIG. 6 is a cross-sectional diagram of another exemplary minimum track standard cell circuit employing high aspect ratio voltage rails with a height to width ratio of approximately two (2)

Additionally, FIG. 6 illustrates a cross-sectional view of another exemplary minimum track standard cell circuit 600 similar to the cross-sectional view illustrated in FIG. 2B. The minimum track standard cell circuit 600 includes certain components in common with the minimum track standard cell circuit 200 in FIG. 2B, as shown by similar element numbers between FIGS. 2A and 6, and thus will not be re-described herein.

With continuing reference to FIG. 6, rather than employing the first and second high aspect ratio voltage rails 202, 204 with a height to width ratio approximately equal to four (4), the minimum track standard cell circuit 600 employs first and second high aspect ratio voltage rails 602, 604 with a height to width ratio of approximately two (2). In particular, the first and second high aspect ratio voltage rails 602, 604 are employed with a height $H_{HAVR}$ that is two (2) times a width $W_{HAVR}$. In this manner, unlike the first and second high aspect ratio voltage rails 202, 204 in FIG. 2B, the first and second high aspect ratio voltage rails 602, 604 do not extend from the corresponding contact layer interconnects 214, 218 to the first via level V1. Thus, the minimum track standard cell circuit 600 employs zero via level vias 606, 608 and first metal layer segments 610, 612, to electrically couple the first and second high aspect ratio voltage rails 602, 604, respectively, to the corresponding first via level V1.

Figure 7:
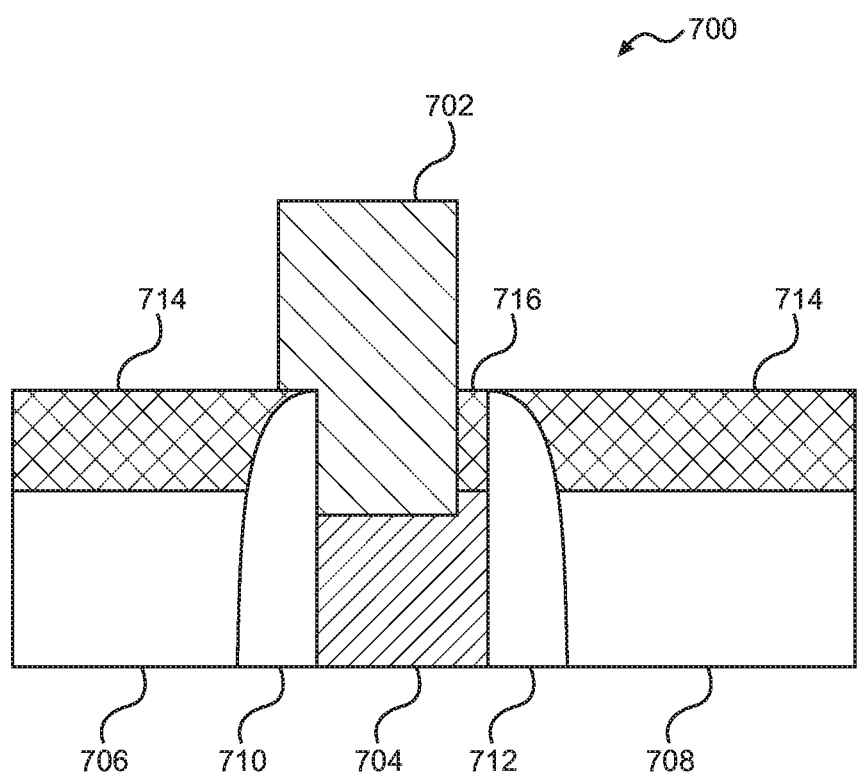
FIG. 7 is a cross-sectional diagram of an exemplary transistor employing a self-aligned gate contact.

As noted above, the gate contacts 224, 226 in the minimum track standard cell circuit 200 of FIG. 2A can be employed as self-aligned gate contacts. To provide greater detail regarding self-aligned gate contacts, FIG. 7 illustrates an exemplary transistor 700 employing a self-aligned gate contact 702. In this aspect, the self-aligned gate contact 702 is disposed over and self-aligned with a gate 704 such that the self-aligned gate contact 702 does not electrically couple to a source 706 or drain 708. By avoiding such electrical coupling with the source 706 and drain 708, the self-aligned gate contact 702 reduces erroneous operation of the transistor 700. More specifically, the gate 704 is disposed between gate spacers 710, 712. The source 706 is disposed adjacent to the gate spacer 710, and the drain 708 is disposed adjacent to the gate spacer 712.

With continuing reference to FIG. 7, to prevent the self-aligned gate contact 702 from electrically coupling to the source 706 or drain 708, a first selective etch material 714 is disposed over the source 706 and drain 708. Additionally, a second selective etch material 716 is disposed over the gate 704. The first selective etch material 714 is resistant to an etch process used to etch the second selective etch material 716. In this manner, the self-aligned gate contact 702 is formed by using an etch process that etches the second selective etch material 716 over the gate 704, but that fails to etch the first selective etch material 714. The self-aligned gate contact 702 is disposed over and electrically coupled to the gate 704. However, the first selective etch material 714 forms a selective etch barrier between the self-aligned gate contact 702 and the source 706 and drain 708. Thus, the self-aligned gate contact 702 does not electrically couple to the source 706 or drain 708. As previously described, self-aligned gate contacts similar to the self-aligned gate contact 702 help enable the minimum track standard cell circuits disclosed herein to reduce the width of a corresponding port zone, thus reducing the area of the minimum track standard cell circuit.

The elements described herein are sometimes referred to as means for performing particular functions. In this regard, the first one-half track 206 is sometimes referred to herein as "a means for providing a first one-half track." Additionally, the first high aspect ratio voltage rail 202 is sometimes referred to herein as "a means for providing a first high aspect ratio voltage rail." The second one-half track 208 is sometimes referred to herein as "a means for providing a second one-half track." Further, the second high aspect ratio voltage rail 204 is sometimes referred to herein as "a means for providing a second high aspect ratio voltage rail." The tracks 222(1)-222(4) are sometimes referred to herein as "a means for providing a plurality of tracks between and substantially parallel to the first and second one-half tracks." Also, the gate contacts 224, 226 are sometimes referred to herein as "a means for providing one or more gate contacts over one or more corresponding active areas formed between and substantially parallel to the first and second one-half tracks."

The minimum track standard cell circuits for reduced area according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
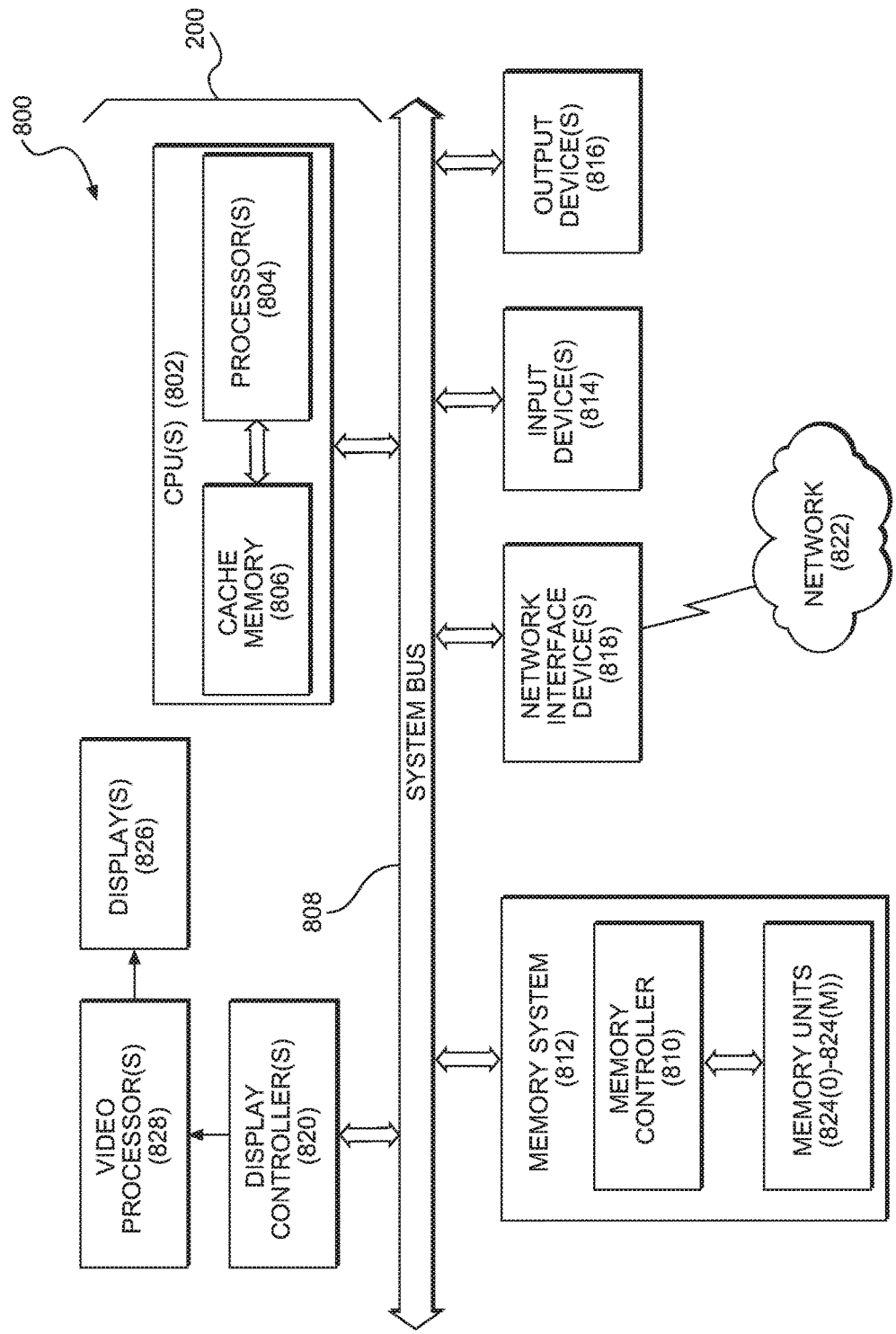
FIG. 8 is a block diagram of an exemplary processor-based system that can include the minimum track standard cell circuit of FIG. 2A.

In this regard, FIG. 8 illustrates an example of a processor-based system 800 that can employ the minimum track standard cell circuit 200 illustrated in FIG. 2A. In this example, the processor-based system 800 includes one or more central processing units (CPUs) 802, each including one or more processors 804. The CPU(s) 802 may have cache memory 806 coupled to the processor(s) 804 for rapid access to temporarily stored data. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812, one or more input devices 814, one or more output devices 816, one or more network interface devices 818, and one or more display controllers 820, as examples. The input device(s) 814 can include any type of input device, including, but not limited to, input keys, switches, voice processors, etc. The output device(s) 816 can include any type of output device, including, but not limited to, audio, video, other visual indicators, etc. The network interface device(s) 818 can be any device configured to allow exchange of data to and from a network 822. The network 822 can be any type of network, including, but not limited to, a wired or wireless network, a private or public network, a local area network (LAN), a wireless local area network (WLAN), a wide area network (WAN), a BLUETOOTH™network, and the Internet. The network interface device(s) 818 can be configured to support any type of communications protocol desired. The memory system 812 can include one or more memory units 824(0)-824(M).

The CPU(s) 802 may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A minimum track standard cell circuit, comprising:
a first one-half track;
a first high aspect ratio voltage rail disposed over the first one-half track, wherein the first high aspect ratio voltage rail has a height to width ratio greater than one (1) and is configured to provide a first voltage to the minimum track standard cell circuit;

a second one-half track;
a second high aspect ratio voltage rail disposed over the second one-half track and substantially parallel to the first high aspect ratio voltage rail, wherein the second high aspect ratio voltage rail has a height to width ratio greater than one (1) and is configured to provide a second voltage less than the first voltage to the minimum track standard cell circuit; and
a plurality of tracks disposed between and substantially parallel to the first and second one-half tracks.

2. The minimum track standard cell circuit of claim 1, wherein the plurality of tracks comprises four (4) tracks.

3. The minimum track standard cell circuit of claim 1, further comprising one or more gate contacts disposed over one or more corresponding active areas formed between and substantially parallel to the first and second one-half tracks.

4. The minimum track standard cell circuit of claim 3, wherein the one or more gate contacts comprise one or more self-aligned gate contacts disposed over and self-aligned with one or more corresponding gates, wherein a selective etch barrier is disposed over a source and drain corresponding to each of the one or more corresponding gates such that the corresponding self-aligned gate contact cannot electrically couple to the corresponding source and drain.

5. The minimum track standard cell circuit of claim 1, wherein:
the first high aspect ratio voltage rail has a width less than three (3) times a width of a metal line disposed in the minimum track standard cell circuit; and
the second high aspect ratio voltage rail has a width less than three (3) times a width of the metal line disposed in the minimum track standard cell circuit.

6. The minimum track standard cell circuit of claim 1, wherein:
the first high aspect ratio voltage rail has a width less than two (2) times a width of a metal line disposed in the minimum track standard cell circuit; and
the second high aspect ratio voltage rail has a width less than two (2) times a width of the metal line disposed in the minimum track standard cell circuit.

7. The minimum track standard cell circuit of claim 1, wherein:
the first high aspect ratio voltage rail has a width approximately equal to a width of a metal line disposed in the minimum track standard cell circuit; and
the second high aspect ratio voltage rail has a width approximately equal to a width of the metal line disposed in the minimum track standard cell circuit.

8. The minimum track standard cell circuit of claim 1, wherein:
the first voltage comprises a source voltage; and
the second voltage comprises a ground voltage.

9. The minimum track standard cell circuit of claim 1, wherein:
the first high aspect ratio voltage rail has a height to width ratio approximately equal to two (2); and
the second high aspect ratio voltage rail has a height to width ratio approximately equal to two (2).

10. The minimum track standard cell circuit of claim 1, wherein:
the first high aspect ratio voltage rail has a height to width ratio approximately equal to three (3); and
the second high aspect ratio voltage rail has a height to width ratio approximately equal to three (3).

11. The minimum track standard cell circuit of claim 1, wherein:
the first high aspect ratio voltage rail has a height to width ratio approximately equal to four (4); and
the second high aspect ratio voltage rail has a height to width ratio approximately equal to four (4).

12. The minimum track standard cell circuit of claim 1 comprising a technology node size equal to approximately ten (10) nanometers (nm).

13. The minimum track standard cell circuit of claim 1 integrated into an integrated circuit (IC).

14. The minimum track standard cell circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device (e.g., a smart watch, a health or fitness tracker, eyewear, etc.); a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

15. A minimum track standard cell circuit, comprising:
a means for providing a first one-half track;
a means for providing a first high aspect ratio voltage rail over the first one-half track, wherein the first high aspect ratio voltage rail has a height to width ratio greater than one (1) and is configured to provide a first voltage to the minimum track standard cell circuit;
a means for providing a second one-half track;
a means for providing a second high aspect ratio voltage rail over the second one-half track and substantially parallel to the first high aspect ratio voltage rail, wherein the second high aspect ratio voltage rail has a height to width ratio greater than one (1) and is configured to provide a second voltage less than the first voltage to the minimum track standard cell circuit; and
a means for providing a plurality of tracks between and substantially parallel to the first and second one-half tracks.

16. The minimum track standard cell circuit of claim 15, wherein the means for providing the plurality of tracks comprises a means for providing four (4) tracks.

17. The minimum track standard cell circuit of claim 15, further comprising a means for providing one or more gate contacts over one or more corresponding active areas formed between and substantially parallel to the first and second one-half tracks.

18. The minimum track standard cell circuit of claim 17, wherein the means for providing the one or more gate contacts comprises a means for providing one or more self-aligned gate contacts over and self-aligned with one or more corresponding gates, wherein a selective etch barrier is disposed over a source and drain corresponding to each of the one or more corresponding gates such that the corresponding self-aligned gate contact cannot electrically couple to the corresponding source and drain.

19. The minimum track standard cell circuit of claim 15, wherein:
the first high aspect ratio voltage rail has a width less than three (3) times a width of a metal line disposed in the minimum track standard cell circuit; and the second high aspect ratio voltage rail has a width less than three (3) times a width of the metal line disposed in the minimum track standard cell circuit.

20. A method of manufacturing a minimum track standard cell circuit, comprising:
   forming a first one-half track;
   disposing a first high aspect ratio voltage rail over the first one-half track, wherein the first high aspect ratio voltage rail has a height to width ratio greater than one (1) and is configured to provide a first voltage to the minimum track standard cell circuit;
   forming a second one-half track;
   disposing a second high aspect ratio voltage rail over the second one-half track and substantially parallel to the first high aspect ratio voltage rail, wherein the second high aspect ratio voltage rail has a height to width ratio greater than one (1) and is configured to provide a second voltage less than the first voltage to the minimum track standard cell circuit; and
   disposing a plurality of tracks between and substantially parallel to the first and second one-half tracks.

21. The method of claim 20, wherein disposing the plurality of tracks comprises disposing four (4) tracks.

22. The method of claim 20, further comprising disposing one or more gate contacts over one or more corresponding active areas formed between and substantially parallel to the first and second one-half tracks.

23. The method of claim 22, wherein disposing the one or more gate contacts comprises disposing one or more self-aligned gate contacts over and self-aligned with one or more corresponding gates, wherein a selective etch barrier is disposed over a source and drain corresponding to each of the one or more corresponding gates such that the corresponding self-aligned gate contact cannot electrically couple to the corresponding source and drain.

24. The method of claim 20, wherein:
   disposing the first high aspect ratio voltage rail comprises disposing the first high aspect ratio voltage rail having a width less than three (3) times a width of a metal line disposed in the minimum track standard cell circuit; and
   disposing the second high aspect ratio voltage rail comprises disposing the second high aspect ratio voltage rail having a width less than three (3) times a width of the metal line disposed in the minimum track standard cell circuit.

25. The method of claim 20, wherein:
   disposing the first high aspect ratio voltage rail comprises disposing the first high aspect ratio voltage rail having a width less than two (2) times a width of a metal line disposed in the minimum track standard cell circuit; and
   disposing the second high aspect ratio voltage rail comprises disposing the second high aspect ratio voltage rail having a width less than two (2) times a width of the metal line disposed in the minimum track standard cell circuit.

26. The method of claim 20, wherein:
   disposing the first high aspect ratio voltage rail comprises disposing the first high aspect ratio voltage rail having a width approximately equal to a width of a metal line disposed in the minimum track standard cell circuit; and
   disposing the second high aspect ratio voltage rail comprises disposing the second high aspect ratio voltage rail having a width approximately equal to a width of the metal line disposed in the minimum track standard cell circuit.

* * * * *